(12) United States Patent
Street et al.

(10) Patent No.: US 10,608,041 B2
(45) Date of Patent: Mar. 31, 2020

(54) BENDABLE X-RAY DETECTOR WITH TFT BACKPLANE IN THE NEUTRAL PLANE

(71) Applicant: Palo Alto Research Center Incorporated, Palo Alto, CA (US)

(72) Inventors: Robert A. Street, Palo Alto, CA (US); Julie A. Bert, East Palo Alto, CA (US); John C. Knights, Soquel, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 15/951,407

(22) Filed: Apr. 12, 2018

(65) Prior Publication Data

US 2019/0319063 A1    Oct. 17, 2019

(51) Int. Cl.
| | |
|---|---|
| H01L 27/146 | (2006.01) |
| H01L 27/12 | (2006.01) |
| H01L 31/0224 | (2006.01) |
| G01T 7/00 | (2006.01) |
| H01L 31/18 | (2006.01) |
| H01L 31/0376 | (2006.01) |
| G01T 1/20 | (2006.01) |

(52) U.S. Cl.
CPC ...... *H01L 27/14663* (2013.01); *G01T 1/2018* (2013.01); *G01T 7/00* (2013.01); *H01L 27/1218* (2013.01); *H01L 27/1222* (2013.01); *H01L 27/1266* (2013.01); *H01L 27/14612* (2013.01); *H01L 27/14623* (2013.01); *H01L 27/14689* (2013.01); *H01L 31/022466* (2013.01); *H01L 31/03762* (2013.01); *H01L 31/1892* (2013.01)

(58) Field of Classification Search
CPC .......... H01L 27/14663; H01L 27/1218; H01L 27/1222; H01L 27/14612; H01L 27/14623; H01L 27/14689; H01L 31/022466; H01L 31/03762; H01L 31/1892
See application file for complete search history.

(56) References Cited

U.S. PATENT DOCUMENTS

| | | | |
|---|---|---|---|
| 2006/0180768 A1* | 8/2006 | Bogdanovich | H01L 27/14676 250/370.09 |
| 2007/0025513 A1* | 2/2007 | Ghelmansarai | A61N 5/1049 378/98.8 |
| 2015/0137088 A1* | 5/2015 | Simon | H01L 27/308 257/40 |
| 2016/0049441 A1* | 2/2016 | Shieh | H01L 27/14663 257/43 |
| 2019/0079201 A1* | 3/2019 | Street | G01T 1/2018 |

OTHER PUBLICATIONS

U.S. Appl. No. 15/702,548, filed Sep. 12, 2017.

* cited by examiner

*Primary Examiner* — Mark W Tornow
(74) *Attorney, Agent, or Firm* — Fay Sharpe LLP

(57) ABSTRACT

Transitioning conventional x-ray detector materials and structures to bendable or flexible (e.g., plastic) substrates makes them rugged against breakage when dropped but exposes the detectors to damage if bent. Disclosed are bendable digital x-ray detector structures that are rugged with regard to bending as well as dropping. The structures provide strain matching between layers so that a detector backplane is in and/or near the mechanical neutral plane and therefore less susceptible to bending stress.

18 Claims, 7 Drawing Sheets

BENDABLE X-RAY DETECTOR WITH TFT BACKPLANE IN THE NEUTRAL PLANE

BACKGROUND

Digital x-ray detector arrays are generally fabricated on a glass substrate having a detector backplane, including an amorphous silicon (a-Si) thin film transistor (TFT) array arrangement, a corresponding a-Si photodiode array arrangement, along with associated metal electrodes and contact lines. An x-ray scintillator is placed in contact with the detector backplane to convert x-rays to light that is detected by the photodiode array arrangement. The scintillator is commonly constructed using Tb-doped gadolinium oxysulphide (GOS) or cesium iodide (CsI), but it is appreciated other materials may also be used. While the GOS scintillator may be bonded to the backplane, more commonly, the GOS scintillator is not bonded to the backplane but instead is pushed into contact therewith. The CsI scintillator may also be deposited and bonded directly on the backplane or alternatively formed as a separate layer and pushed into contact with the backplane. The completed digital x-ray detector includes the glass substrate which results in a substantially rigid device.

In looking to develop more flexible designs, the structures described above can be deposited on a flexible plastic substrate instead of a glass substrate to increase flexibility. However, many of the materials used in the digital x-ray detector structure including a-Si, indium tin oxide (ITO—an oxide semiconductor used to form a photodiode transparent top contact), and CsI are either brittle or fragile and have a tendency to crack under the strain of bending. An exception (among others) is GOS, which is made as powder in a polymeric binder and has a relative amount of flexibility.

As a result transitioning the conventional detector materials and structures from glass to flexible plastic substrates makes them rugged against breakage when dropped, but exposes the detectors to damage when bent.

This is an issue as bendable detectors are of significant interest, for example, in areas of security such as to inspect pipelines or other curved objects, to image objects in confined spaces where a rigid flat detector could not be introduced, and to conform to the human body for added comfort and resolution, among a multitude of other uses. Consequently, it is deemed desirable to engineer flexible detectors that remain robust to bending, as well as when dropped.

INCORPORATION BY REFERENCE

Applicants hereby incorporate by reference in its entirety U.S. patent application Ser. No. 15/702,548 Filed Sep. 12, 2017, Titled: Monolithic Digital X-Ray Detector Stack With Energy Resolution.

BRIEF DESCRIPTION

A bendable digital x-ray detector includes a detector backplane having a first side, and a second side. The backplane includes TFTs, photodiodes and interconnects formed on a flexible substrate, the first side facing out from the flexible substrate and the second side facing into the flexible substrate. A first arrangement (e.g., one of an overlayer or underside layer) being associated with the first side of the detector backplane, and a second arrangement (e.g., one of an overlayer or underside layer) being associated with the second side of the detector backplane. An elasticity and thickness of the first arrangement and an elasticity and thickness of the second arrangement position the detector backplane in and/or a mechanically neutral plane between the first arrangement and the second arrangement.

The first arrangement includes a scintillator, and the second arrangement includes a substrate and an underside protection layer.

The first arrangement includes a scintillator, and the second side arrangement includes a substrate and a second scintillator.

The first arrangement includes a substrate, and the second side arrangement includes a substrate, wherein a scintillator is pressed up against the first arrangement in a non-bonded manner.

The x-ray detector further includes a second detector backplane having a first side and a second side, wherein the second detector backplane is positioned behind the detector backplane, and wherein the detector backplane and the second detector backplane are in and/or near the mechanical neutral plane.

The detector backplane includes a-Si TFTs and photodiodes.

The detector backplane includes transparent bottom contacts and transparent top contacts of an array of photodiodes.

The scintillator and the second scintillator are designed to optimize x-ray performance while maintaining the detector backplane in and/or near the mechanical neutral plane.

The detector backplane includes one of oxide semiconductor and polysilicon.

The scintillator includes one of Tb-doped gadolinium oxysulphide (GOS) and cesium iodide (CsI).

The scintillator and the second scintillator are made from different materials.

The detector backplane and the second detector backplane are positioned to provide energy resolution information.

The detector backplane and the second detector backplane arrangement including additional x-ray shielding to provide energy resolution information.

The underside protection is a flexible polymer.

The substrate is polyimide (PI).

The detector backplane is an array structure including a-Si, and photodiodes which are at least partially transparent (ITO).

A method of manufacturing a bendable x-ray detector includes, providing a glass manufacturing substrate; placing a substrate on a surface of the glass manufacturing substrate; placing a detector backplane on the substrate; placing an arrangement on the detector backplane; releasing the substrate from the glass manufacturing substrate; and associating another arrangement with at least one of the t substrate, and the arrangement on the detector backplane.

The method wherein the arrangement on the detector backplane includes one of a scintillator, and the other flexible layer.

The method wherein another arrangement includes at least one of an underside protector associated with the substrate, a scintillator associated with the substrate, and a scintillator associated with the other flexible layer.

DETAILED DESCRIPTION

The present application discloses digital x-ray detector structures that are rugged with regard to bending as well as dropping.

There are variety of processes to manufacture detector backplanes, which for example may include an amorphous silicon (a-Si) thin film transistor (TFT) array arrangement, a corresponding a-Si photodiode array arrangement, along with associated metal electrodes and contact lines on a flexible substrate.

Further in the following embodiments control chips used to address, readout and to perform other operations related to the detector backplane may also be understood to be carried on and/or attached to the flexible substrate and therefore are understood to be described in the following figures when referencing the detector backplane.

A common manufacturing process is to form a thin film or layer (e.g., polyimide (PI) layer) on a glass substrate. An a-Si TFT detector backplane is then manufactured with essentially the same process as if it were on glass without the PI layer. After this processing is complete, the scintillator, such as, but not limited to, a GOS type scintillator is bonded to the front surface to provide support to the thin PI film and the detector backplane layer. The combination is then released from the glass manufacturing substrate and an underside protection layer (e.g., plastic layer) is bonded to the back side of the PI layer for additional protection. These two layers (plastic backing and GOS scintillator) add ruggedness to the detector, with regard to dropping. However such a structure does not improve bendability, as bending actions causes strain in the thin film layers that form the electrical structure of the detector backplane.

Therefore the present disclosure provides further advances to the above manufacturing process to provide an increase in the bendability of such designs. More particularly the present disclosure provides strain matching between the substrate (e.g., PI substrate) and the other bonded layers of the detector so the a-Si detector backplane layer of the structure is in and/or near a mechanical neutral plane. The bonding of layers using appropriate binding materials.

Figure 1:
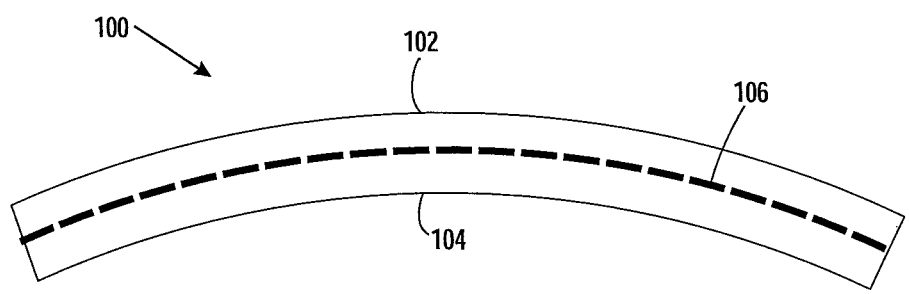
FIG. 1 illustrates the zero strain mechanical neutral plane (dashed line) in the center of a uniform bendable foil.

It is to be appreciated that when a sheet-like bendable material is bent, one surface (e.g., the convex side) experiences tensile stress and the opposite side (e.g., the concave surface) has compressive stress. In a uniformly provided material the strain is equal to the bending angle θ times the distance x from the center of the material and the stress is the strain times Young's modulus, Y, so that the stress=Y.x.θ. There is a mechanical neutral plane that experiences zero stress in the middle of the material at x=0. The position of the mechanical neutral plane in a multi-layer material depends on the thickness and Young's modulus of the different layers and can be calculated by an extension of the formula for a single material as is well known in the art. An example of this is depicted by multilayer design 100 of FIG. 1, which is shown in a bent position. In this example an upper surface 102 is the convex side, and a lower surface 104 is the concave surface. Further identified is a mechanical neutral plane 106, which identifies a zero stress location. Also, along with generating zero stress at this location, zero strain is also generated, and so material in and/or near the mechanical neutral plane 106 is less susceptible to strain-related cracking.

Figure 2:
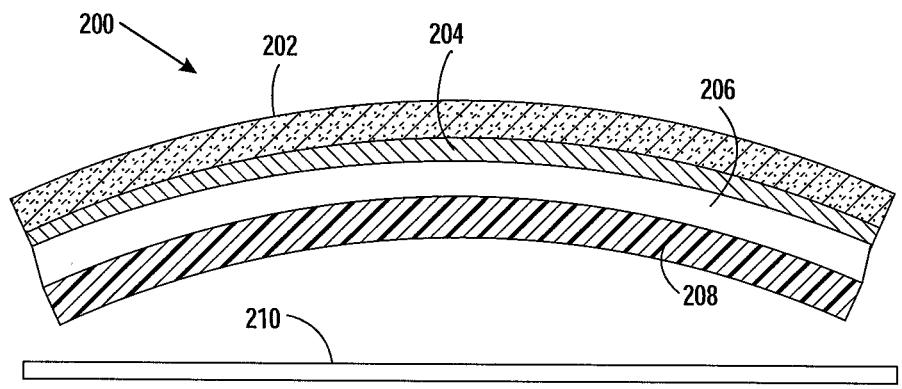
FIG. 2 illustrates a bent x-ray detector after deposition on a PI film and subsequent bonding to the GOS scintillator and the underside protection layer.

Turning to FIG. 2, illustrated is a bendable multilayer x-ray detector structure 200 constructed according to the present application. FIG. 2 illustrates the layers of the multilayer detector 200 when it is bent. Multilayer detector 200 includes, a scintillator layer 202 (e.g., a GOS, CsI, or other appropriate material), a-Si detector backplane 204 (e.g., including an amorphous silicon (a-Si) thin film transistor (TFT) array arrangement, a corresponding a-Si photodiode array arrangement, along with associated metal electrodes, interconnects and contact lines, a substrate 206 (e.g., a PI substrate) which is understood to be the device substrate, and an underside protection layer 208 (e.g., a flexible plastic material, such as but not limited to polycarbonate, or other polymer). The multilayer x-ray detector 200 is configured and sized to include a mechanical neutral plane inhabited by the detector backplane 204.

To further describe the present concepts also depicted in FIG. 2 is a glass manufacturing substrate 210 (or other appropriate material) on which at least some of the layers described above are deposited during the manufacturing process, and thereafter such layers are released. It is understood that prior to release from the glass manufacturing substrate the deposited layers are substantially planar or flat, and may remain flat after release until acted upon in some manner by an external force.

The position of the mechanical neutral plane (in this case the plane corresponding to that occupied by detector backplane 204) is calculated as described above, knowing the Young's modulus (i.e., the elasticity) of each of the layers (e.g., GOS top layer, the various other layers that make up the a-Si backplane, PI substrate, underside protection layer). The GOS layer thickness is generally chosen for its x-ray absorption properties. The PI layer typically has some thickness limitations due to backplane manufacturing requirements. However, the underside protection layer can be selected from a wide range of thicknesses and materials having distinct elasticities. Hence the material and thickness combination for the underside protection can be chosen based on material properties so the detector backplane 204 is in the mechanical neutral plane. With this design the detector 200 is much more robust to bending than when the materials and thicknesses are not chosen in this manner.

It is appreciated that the mechanical neutral plane is an exact position in the multilayer material and the stress increases linearly with distance away from the neutral plane. However, all materials can accommodate some stress without damage. Hence it is sufficient for this design that the backplane be close enough to the neutral plane that the backplane materials are within their stress tolerance when the structure is bent to a required radius of curvature, which for typical applications, such as but not limited to x-ray detector applications is usually not less than approximately 2-5 cm. It is also understood that the mechanical properties of the substrate, the overlayer and the underside layer might not be known precisely so that the actual position of the neutral plane can be different from the calculated position, causing some stress in the backplane. The beneficial effects of stress reduction will remain so long as the backplane is positioned close to the neutral plane, such that the backplane stress is no more than approximately 10-20% of the value that would occur without the stress reduction layer concepts disclosed herein.

It is appreciated the types of materials and thicknesses may also be determined experimentally or by trial and error (as opposed to and/or in combination with calculations which are well known in the art). Such experimentation or trial and error employing, for example, strain measurement devices to verify the location of the detector backplane as being in the mechanical neutral plane.

For the above and following embodiments described herein, typical thicknesses for the various layers include but are not limited to:

(i) GOS scintillator; 200-600 micron
(ii) a-Si TFT backplane; 1-2 micron (comprising the a-Si TFTs, photodiodes, metal electrodes and contact lines)
(iii) Substrate (e.g., the PI device substrate) 10-20 micron
(iv) Underside protection (e.g., flexible plastic) 50-400 micron It is noted the a-Si detector backplane layer 204 is much thinner than the layers 202, 206, 208 of the remainder of structure 200. Therefore when the detector layer 204 is in the mechanical neutral plane the TFTs, the photodiodes and other elements of the detector backplane layer 204 will be effectively in the strain-free mechanical neutral plane.

Figure 3:
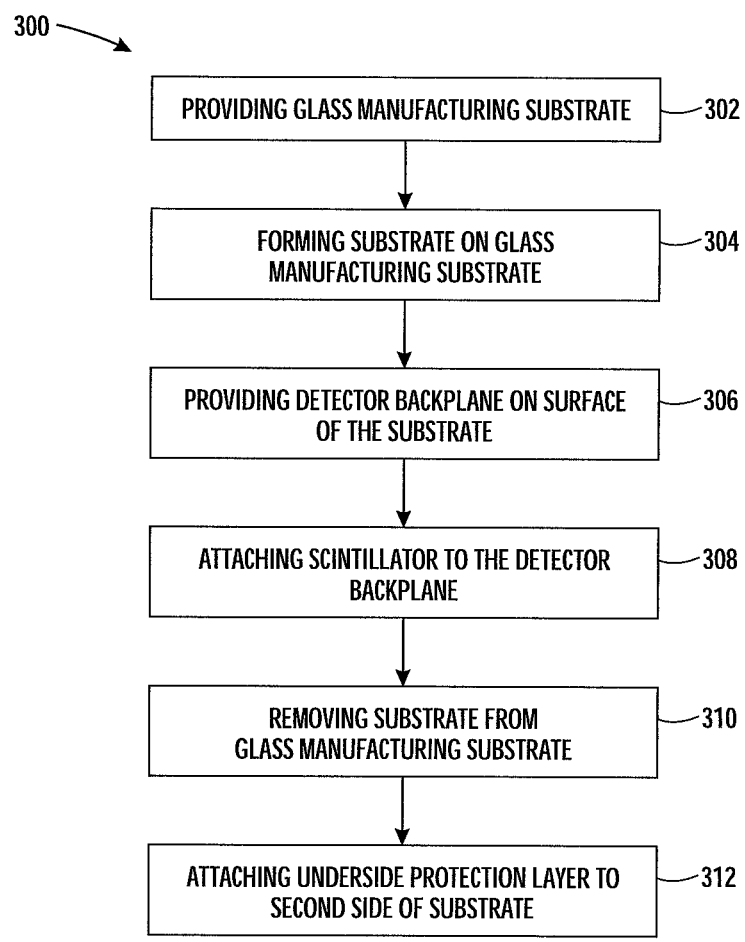
FIG. 3 is a flow diagram for the device of FIG. 2.

Turning to FIG. 3 set forth is a manufacturing process 300, for production of a device according to FIG. 2. In step 302 glass manufacturing substrate 210 is provided, and then in step 304 substrate (e.g., a PI device substrate) 206 is formed thereon. Such forming taking place by any appropriate deposition or other manufacturing process to provide the substrate. Then in step 306 a detector backplane (e.g., a-Si based detector backplane) 204 is provided on a surface of the t device substrate 206. At this point, step 308, scintillator 202 is attached, such as by bonding or other appropriate manufacturing process to the detector backplane 204. This attachment takes place prior to the removal of the substrate and detector backplane layers from the glass manufacturing substrate 210. The process attaches the scintillator 202 prior to removal in order to provide a stiffness and/or durability to the layers, as the substrate 206 and detector backplane 204 are of such a thinness that manufacturability would otherwise be an issue.

After attachment of the scintillator, step 310, the substrate 206 is removed from the glass manufacturing substrate 210 by known removal processes such as, but not limited to UV laser removal, thereby also releasing the other layers built thereon. At this point the detector backplane 204 is commonly not in the mechanical neutral plane. In these situations, step 312, underside protection layer 208 is selected (choosing the appropriate elasticity and thickness) and attached (e.g., through bonding or other appropriate manufacturing process), to a second side of the substrate 206 (i.e., on the side released from the glass substrate 210). This action locates the detector backplane 204 in the mechanical neutral plane.

The bonding operations employ an appropriate binding material, with the characteristics of such binding material being taken into account in order to locate the detector backplane into the mechanical neutral plane.

Figure 4:
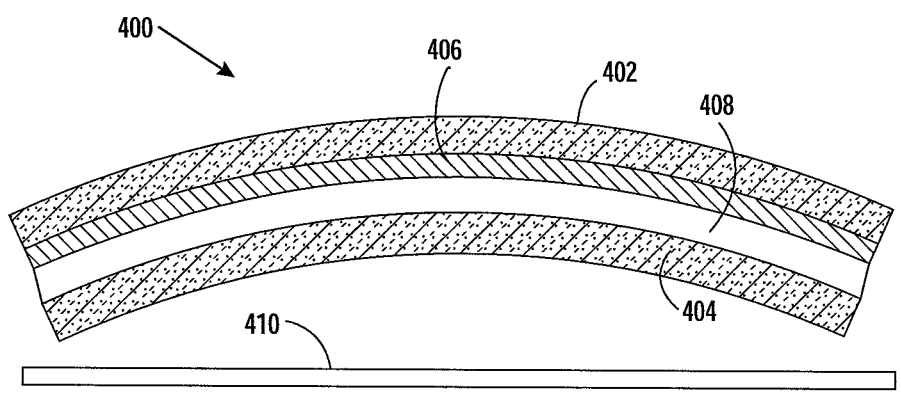
FIG. 4 illustrates a bent x-ray detector after deposition on a PI film and subsequent bonding to the GOS scintillator, but with the underside protection layer replaced by a second layer of scintillator.

Turning to FIG. 4 illustrated is another embodiment of the present disclosure. It is understood that there can be an advantage for an x-ray detector to have scintillators placed on both sides of the x-ray detector, as is known in the art for x-ray film. The reason is that light emanating from an x-ray absorption event in the scintillator is scattered and so diffuses away from the point of absorption with a lateral diffusion that grows with the distance the emitted photons travel. This lateral diffusion reduces the spatial resolution of the detector. Hence the choice of scintillator thickness is a compromise between high x-ray absorption (from the larger absorption of a thick scintillator) and high spatial resolution (from the reduction in lateral diffusion of photons as they exit a thin scintillator).

The multilayer digital x-ray detector structure 400 of FIG. 4 addresses this matter by including scintillator layers 402, 404 on opposite sides of the detector structure 400, which also includes detector backplane layer 406, and device substrate 408 (e.g., PI substrate). This configuration provides an increased total scintillator thickness, and hence higher sensitivity, for a particular spatial resolution when compared to a single scintillator device.

Adding second scintillator 404 (e.g., a GOS scintillator) on an underside of the substrate 408 (e.g., PI substrate) is possible because the PI film can be thin (i.e. 10-20 microns) compared to the GOS layer (i.e. 400-500 um) and so does not contribute significantly to a reduction of the spatial resolution. The digital x-ray detector structure 400 can be made with GOS layers or films 402, 404 bonded to both the top and bottom sides of the detector, with the thickness of the two GOS films chosen such that the a-Si detector 406 is in the mechanical neutral plane of the combined bonded structure and hence strain-free.

A potential modification of the TFT backplane for detector structure 400 configuration of FIG. 4 is that the photodiode layer will include a transparent bottom contact (as well as the already implemented transparent upper contact from the previous discussion), so that light from the underside GOS is detected by the photodiode. Though a transparent bottom photodiode conductor could also be used in the first configuration. The transparent contact can be ITO or any other transparent conductors known in the art.

To increase x-ray detection performance, scintillator 402 that is between the x-ray source (not shown) and detector backplane (front side) 406 is commonly thinner than the scintillator 404 on the opposite (back) side of such an arrangement. The reason being that absorbed x-ray flux is largest on the incident surface and decreases with depth. Hence for the front side scintillator 402, most of the light generating x-ray absorption events occur on the far side of the top scintillator 402 from the detector backplane 406 and consequently needs to diffuse through the remaining thickness of scintillator 402 to reach the detector backplane 406. Any remaining x-ray flux incident on the back side scintillator 404 will most likely be absorbed at the top surface of that scintillator 404 which is closer to the detector 406. Hence the choice of thickness for the backside scintillator 404 to keep the detector 406 in the neutral plane, while being an improvement over a single top side scintillator layer, may not be the optimum thickness. However, the thickness can be modified to a more optimum value if the binder material for the front side scintillator 402 and back side scintillator 404 are chosen such that the resulting difference in Young's modulus compensates for the different scintillator thickness to achieve optimum x-ray detection. The digital x-ray detector structure 400 can also be designed for incident x-rays through either side of the full structure allowing more design freedom, because the photodiode has transparent contacts on top and bottom and a scintillator on both sides of the structure.

To further describe the present concepts also depicted in FIG. 4 is a glass manufacturing substrate 410 (or other appropriate material) on which at least some of the layers described above have been deposited, and where after such layers have been released.

Figure 5:
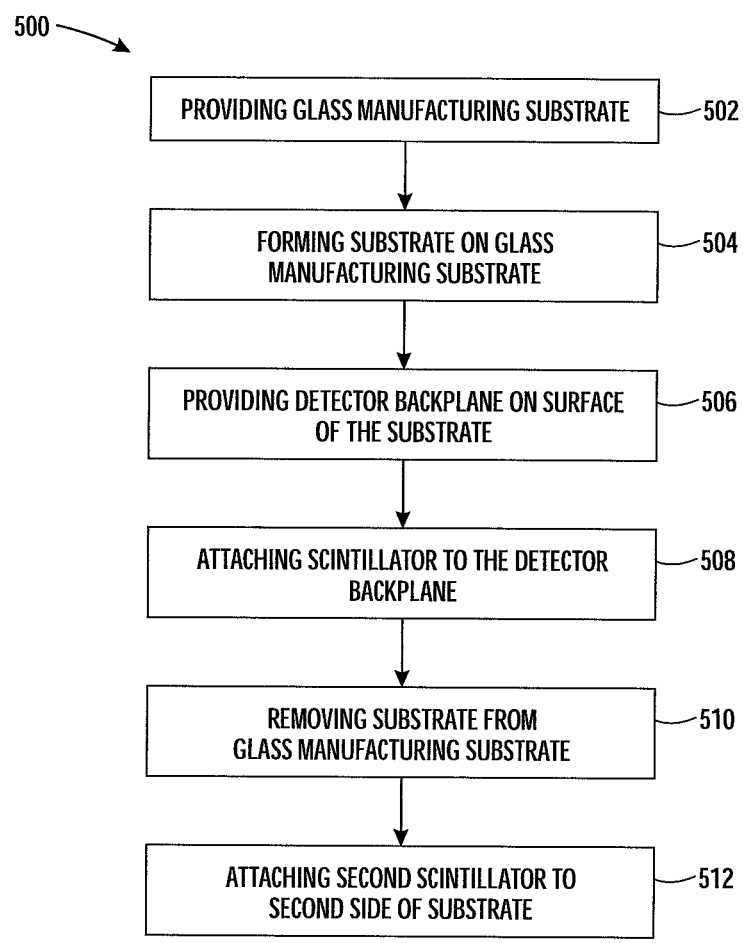
FIG. 5 is a flow diagram for the device of FIG. 4.

Turning to FIG. 5 set forth is a manufacturing process 500, for production of a device according to FIG. 4. In step 502 glass manufacturing substrate 410 is provided, and then in step 504 substrate (e.g., a PI substrate) 408 is formed. Such forming taking place by any appropriate deposition or other manufacturing process to provide the substrate. Then, step 506, detector backplane (e.g., a-Si based detector backplane) 406 is provided on a surface of substrate 408. At this point in step 508 scintillator 402 is attached, such as by bonding or other appropriate manufacturing process, to the detector backplane 406. This attachment takes place prior to the removal of the substrate and detector backplane layers from the glass manufacturing substrate 410. The process attaches the scintillator 402 prior to removal in order to provide a stiffness and/or durability to the layers, as the substrate 408 and detector backplane 406 are of such a thinness that manufacturability would otherwise be an issue. After attachment, step 510, the substrate 408 is removed from the glass manufacturing substrate 410 by known removal processes such as, but not limited to UV laser removal, thereby also releasing the other layers built thereon. At this point the detector backplane 406 is commonly not in the mechanical neutral plane. Now in this embodiment, distinct from that of FIG. 2, instead of attaching an underside protection layer (e.g., 208 of FIG. 2), in this embodiment, step 512, second scintillator 404 is selected and is attached/bonded to a second side of the substrate 408 (i.e., the side released from the glass substrate 410. This action locates the detector backplane 406 in the mechanical neutral plane.

The bonding operations employ an appropriate binding material, with the characteristics of such binding material being taken into account in order to locate the detector backplane into the mechanical neutral plane.

Figure 6:
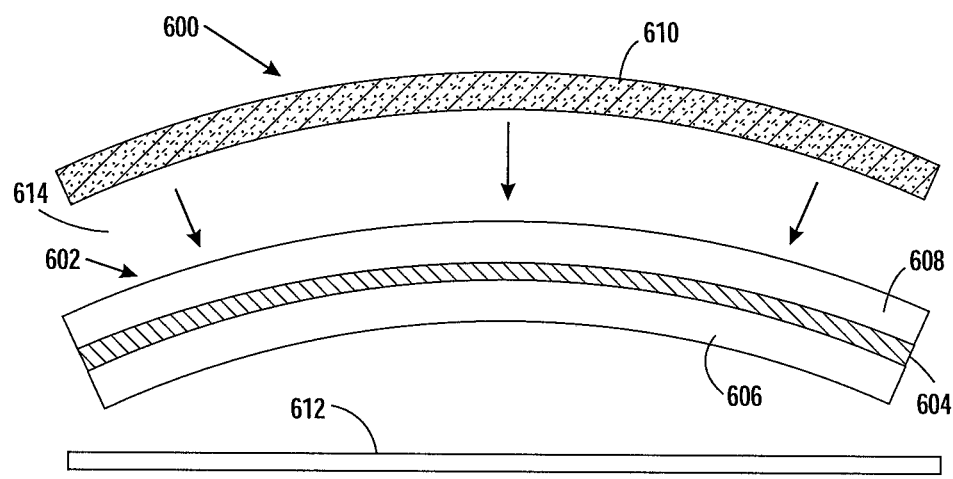
FIG. 6 illustrates another embodiment of a bent x-ray detector with a non-bonded scintillator.

Turning to FIG. 6 illustrated is another embodiment of a digital x-ray detector structure 600 according to the present disclosure. In this configuration formed is a multilayer arrangement 602, which includes a detector backplane 604, positioned between a flexible or bendable device substrate 606, and another flexible layer or film 608, and a scintillator 610. It is shown that scintillator 610 is not bonded to the flexible layer 608 (e.g., PI layer or film) prior to removal of the substrate 606 from the temporary manufacturing glass substrate 612 on which the multilayer arrangement 602 is formed. Instead, in this embodiment once substrate 606, and detector backplane layer 604 have been formed (while attached to the temporary building substrate 612) then the other layer 608 is deposited to this construction on the front side of the detector backplane layer 604. The thicknesses and material of the device substrate 606, and the other flexible layer 608 being chosen so that the TFT/photodiode backplane detector layer 604 is positioned in the mechanical neutral plane of the multilayer arrangement 602, such as discussed above.

An approach to manufacture the above is to form the other flexible layer 608 by coating the structure with PI to a same thickness as the device substrate (e.g., with (PI) material) 606, whereby again the detector backplane layer or film 604 is located in the mechanical neutral plane. It is understood overcoat materials other than PI may be used, and this might change the necessary thickness of the chosen material in order to place the detector backplane layer 604 at the mechanical neutral plane. Once other flexible layer 608 is provided, the resulting sandwich array structure is removed from the temporary glass building substrate 612.

The scintillator 610, either one or two-sided (see FIGS. 2 and 4) is moved 614 next to and in contact with, but not bonded to layer 608, which is adjacent to the detector backplane layer 604. The multilayer arrangement 602 keeps the TFT/photodiode backplane layer 604 at the neutral plane during bending irrespective of the scintillator layer(s) thickness and in the case of multiple scintillators (see FIG. 4) on both sides, even if the multiple scintillators have different thicknesses. While shown with the elements of this embodiment in a bended form, it is understood that alternatively the scintillator(s) are moved next to the multilayer arrangement 602 while still in a planar state (i.e., unbent).

Thus multilayered arrangement 602 may be used with a variety of scintillator arrangements of differing materials and thicknesses, as they are not bonded to the multilayer arrangement 602 and therefore will not alter the location of the mechanical neutral plane.

Figure 7:
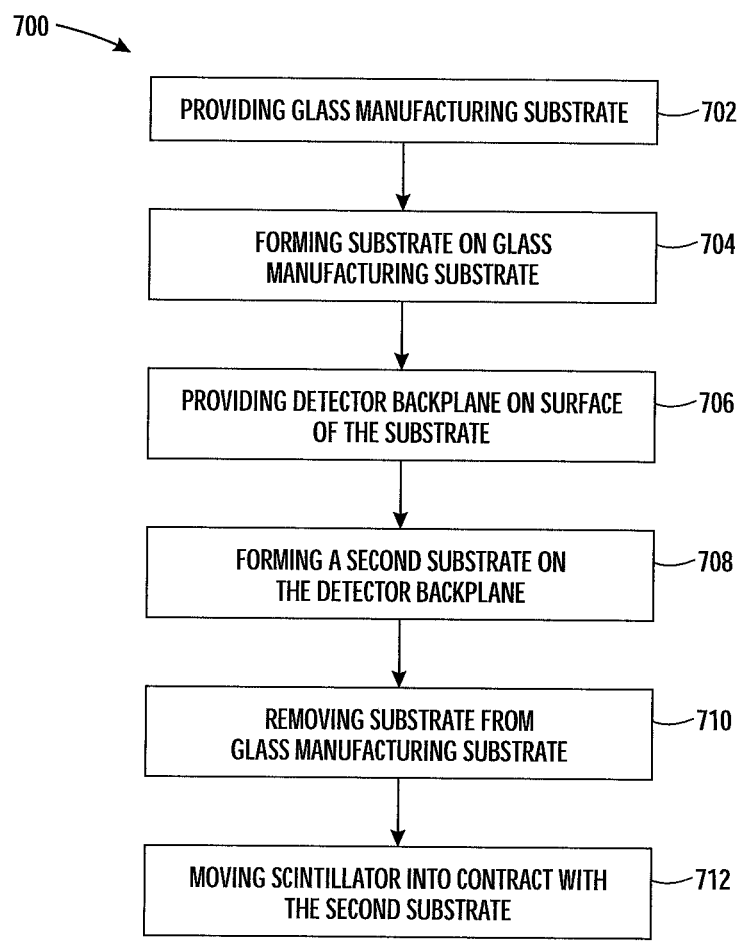
FIG. 7 is a flow diagram for the device of FIG. 6.

Turning to FIG. 7 set forth is a manufacturing process 700, for production of a device according to FIG. 6. In step 702 glass manufacturing substrate 612 is provided, and in step 704 device substrate (e.g., a PI substrate) 606 is formed thereon. Such forming taking place by any appropriate deposition or other manufacturing process to provide the substrate. Then, step 706, detector backplane (e.g., a-Si based detector backplane) 604 is provided on a surface of substrate 606. At this point, step 708, another flexible layer 608 is attached, by an appropriate manufacturing process, to the detector backplane 604. This attachment takes place prior to the removal of the substrate and detector backplane layers from the glass manufacturing substrate 612. The process attaches the other flexible layer prior to removal in order to provide a stiffness and/or durability to the layers. After attachment, step 710, the substrate layer 606 is removed from the glass manufacturing substrate 612 by known removal processes such as, but not limited to UV laser removal, thereby also releasing the other layers built thereon, and providing multilayered structure 602. At this point, by proper thickness selection of the substrate 606 and the other flexible layer 608 the detector backplane 604 is in the mechanical neutral plane. Next, step 712, scintillator 610 is moved or pushed into contact with the surface of the other flexible layer 608. By this configuration the detector backplane 604 remains in the neutral plane, as the scintillator 610 is not a bonded part of the multilayer arrangement 602.

When and if required any bonding operations used herein employ an appropriate binding material, with the characteristics of such binding material being taken into account in order to locate the detector backplane in the mechanical neutral plane.

Figure 8:
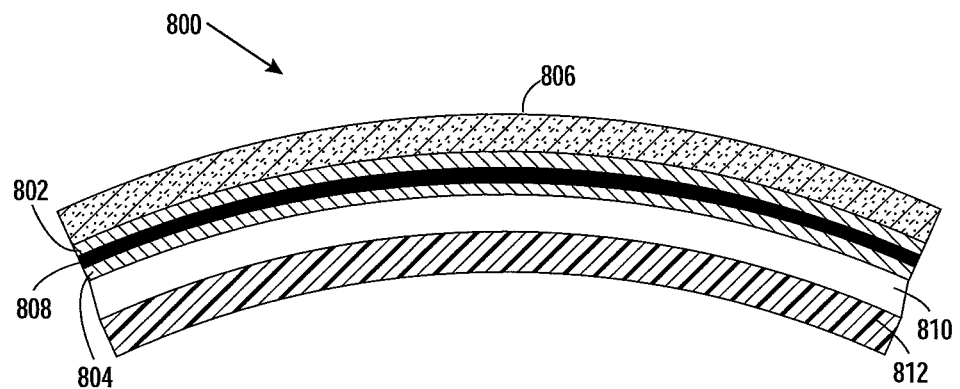
FIG. 8 illustrates another embodiment of a bent x-ray detector with two detector backplanes.

Turning to FIG. 8 another embodiment of the present disclosure is depicted by digital x-ray detector structure 800, which includes bendable x-ray detector backplanes 802, 804, arranged to enable energy resolution. As x-rays pass through a scintillator 806 some are absorbed and some are transmitted. Generally the higher energy x-rays are preferentially transmitted, but this depends on the specific scintillator, which typically has a maximum absorption at a specific energy (the k-edge absorption). Therefore, as shown by arrangement 800, second x-ray detector backplane 804 placed behind the first x-ray detector backplane 802 will detect a different x-ray energy distribution. Moreover, an absorber material 808 is optionally placed between the two detector backplanes 802, 804 to block a range of x-ray energies. The detector backplane and the second detector backplane arrangement including x-ray shielding to provide energy resolution information.

As in other embodiments described herein, also included is a substrate 810, and an underside protection layer 812. The thickness and elasticity (Young's Modulus) of the materials are selected to place the two detector backplanes 802, 804 in the neutral plane. The concept here is that the two detector backplanes (and optional absorber material) are of a sufficient thinness in comparison to the remainder of the layers that both (802, 804) may be at substantially the natural plane.

Comparison of the response of the two detector backplanes 802, 804, gives information about the energy distribution of the incident x-rays, which is often of considerable utility in interpreting the captured image. Such a structure as arrangement 800 can be made from any of the individual x-ray detector structures described in this disclosure. The thin PI substrate has an advantage over a glass substrate for this device embodiment, because a thick glass substrate causes unwanted x-ray absorption due to the larger absorption cross section while the thinner PI substrate has much reduced x-ray absorption. While two x-ray detector backplanes 802, 804 are shown it is to be appreciated three or more stacked detector backplanes are possible for greater energy resolution.

The manufacturing processes for this embodiment is similar to that described in connection with FIG. 2 except with the addition of the second detector backplane.

Figure 9:
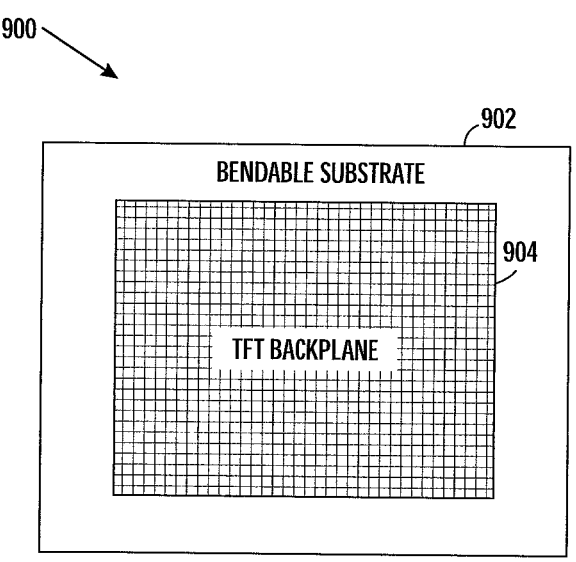
FIG. 9 illustrates a view of a detector backplane and flexible/bendable substrate.

Turning to FIG. 9 illustrated is an exemplary view of an arrangement 600 including a detector backplane 902 carried on a bendable substrate 904.

Having described the foregoing, it is noted an aspect of the present application includes the concept of a multilayer digital x-ray detector structure that is designed specifically such that the detector backplane(s) is/are in the mechanical neutral plane of the structure.

Another aspect of the present application is that a bendable x-ray detector can be fabricated from conventional a-Si technology. Bendability is important for applications such as detecting weld failures in pipelines, monitoring other curved structures and some medical or dental application.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A bendable digital x-ray detector comprising:
    a detector backplane having a first side and a second side, formed on a substrate, the detector backplane having a thickness of 1-2 microns;
    a first arrangement including at least a scintillator bonded to the first side of the detector backplane, the scintillator having a thickness of 200-600 microns; and
    a second arrangement including at least the substrate formed to the second side of the detector backplane, wherein an elasticity and a thickness of the first arrangement and an elasticity and a thickness of the second arrangement position the detector backplane in or near a mechanically neutral plane between the first arrangement and the second arrangement and wherein the materials and thicknesses of at least the detector backplane, the first arrangement, and the second arrangement allows a bend radius of 2-5 cm, at which the detector backplane stress is no more than approximately 10% to 20% of a value that would occur without the detector backplane layer being in or near the mechanically neutral plane.

2. The bendable digital x-ray detector of claim 1 wherein the second arrangement further includes an underside protection layer bonded to the substrate.

3. The bendable digital x-ray detector of claim 2 wherein the scintillator includes one of Tb-doped gadolinium oxysulphide (GOS) and cesium iodide (CsI).

4. The bendable digital x-ray detector of claim 2 wherein the underside protection is a flexible polymer.

5. The bendable digital x-ray detector of claim 2 wherein the substrate is polyimide (PI).

6. The bendable digital x-ray detector of claim 1 wherein the second side arrangement further includes a second scintillator bonded to the substrate.

7. The bendable digital x-ray detector of claim 6 wherein the scintillator and the second scintillator are positioned distanced from each other to increase the x-ray performance of the bendable digital x-ray while maintaining the detector backplane in or near the mechanical neutral plane.

8. The bendable digital x-ray detector of claim 6 wherein the scintillator and the second scintillator are made from different materials.

9. The bendable digital x-ray detector of claim 8 wherein the detector backplane and the second detector backplane are positioned in relation to each other to provide energy resolution information by detecting the response from the scintillators made from different materials.

10. The bendable digital x-ray detector of claim 8 wherein the detector backplane and the second detector backplane and x-ray shielding are arranged to provide energy resolution information by detecting the response from the scintillators made from different materials.

11. The bendable digital x-ray detector of claim 1 further including:
    a second detector backplane having a first side and a second side, wherein the second detector backplane is bonded behind the detector backplane, and wherein at least a portion of the detector backplane and the second detector backplane are in or near the mechanical neutral plane.

12. The bendable digital x-ray detector of claim 1 wherein the detector backplane includes a-Si and photodiodes.

13. The bendable digital x-ray detector of claim 12 wherein the detector backplane includes transparent bottom contacts and transparent top contacts of an array of photodiodes.

14. The bendable digital x-ray detector of claim 1 wherein the detector backplane includes one of oxide semiconductor and polysilicon.

15. The bendable digital x-ray detector of claim 1 wherein the detector backplane is an array structure including a-Si, and photodiodes which are at least partially transparent.

16. The bendable digital x-ray detector of claim 1 wherein the second arrangement includes the substrate, with a thickness of 10-20 microns.

17. The bendable digital x-ray detector according to claim 16 further including an underside protection layer including at least a flexible plastic, with a thickness of 50-400 microns, bonded to the substrate.

18. A bendable digital x-ray detector comprising:
    a detector backplane having a first side and a second side, formed on a substrate, the detector backplane includes one of a-Si, an oxide semiconductor, and a polysilicon, the detector backplane having a thickness of 1-2 microns;

a first arrangement including at least a scintillator bonded to the first side of the detector backplane, the scintillator includes one of Tb-doped gadolinium oxysulphide (GOS) and cesium oxide (CsI), the scintillator having a thickness of 200-600 microns; and a second arrangement including at least the substrate formed to the second side of the detector backplane, the substrate is a polyamide (PI) wherein an elasticity and a thickness of the first arrangement and an elasticity and a thickness of the second arrangement position at least a portion of the detector backplane in or near a mechanically neutral plane between the first arrangement and the second arrangement and wherein the materials and thicknesses of at least the detector backplane, the first arrangement, and the second arrangement allows a bend radius of 2-5 cm, at which the detector backplane stress is no more than approximately 10% to 20% of a value that would occur without the detector backplane layer being in or near the mechanically neutral plane.

* * * * *